United States Patent [19]

Patterson, Jr. et al.

[11] 3,989,332

[45] Nov. 2, 1976

[54] PRINTED CIRCUIT CONNECTOR MEANS

[75] Inventors: Charles A. Patterson, Jr., McDonald; Arthur H. Winyard, Cortland; John A. Yurtin, Southington, all of Ohio

[73] Assignee: General Motors Corporation, Detroit, Mich.

[22] Filed: Jan. 27, 1975

[21] Appl. No.: 544,133

[52] U.S. Cl. .......................... 339/17 C; 339/217 S

[51] Int. Cl.[2] ...................... H05K 1/07; H01R 9/12

[58] Field of Search ............. 339/17 R, 17 C, 17 L, 339/17 M, 17 LC, 47–49, 176 MF, 176 MP, 252, 217 S

[56] References Cited

UNITED STATES PATENTS

| | | | |
|---|---|---|---|
| 3,277,425 | 10/1966 | Marshall et al. | 339/217 S |
| 3,601,751 | 8/1971 | Pauza | 339/17 L |
| 3,613,043 | 10/1971 | Scheller et al. | 339/17 C |
| 3,742,430 | 6/1973 | Cairns et al. | 339/252 R |
| 3,864,007 | 2/1975 | Plyler et al. | 339/17 LC |
| 3,874,769 | 4/1975 | Simon | 339/217 S |

OTHER PUBLICATIONS

B404,290, Jan. 1975, Friend, 339/17 M.

*Primary Examiner*—Joseph H. McGlynn
*Assistant Examiner*—Craig R. Feinberg
*Attorney, Agent, or Firm*—F. J. Fodale

[57] ABSTRACT

An electrical connector means for a printed circuit comprises a sheet metal terminal adapted for insertion into a hole through the printed circuit board from one side and electrical connection with a printed circuit on the opposite side of the printed circuit board. The terminal has upright relatively rigid slotted wings which biasingly engage opposite surfaces of the printed circuit board portions received in the wing slots. The wings which mechanically secure the terminal to the printed circuit board operate independently of a resilient tongue of the terminal located between the wings which establishes electrical connection with the printed circuit. The printed circuit board and terminal may also be provided with cooperating structure means for aiding assembly, proper terminal seating, terminal protection and latching.

3 Claims, 4 Drawing Figures

PRINTED CIRCUIT CONNECTOR MEANS

This invention relates generally to an electrical connector means and more specifically to electrical connector means for connecting an electrical lead or wire to a printed circuit.

In pending patent application, Ser. No. 388,016 filed by Robert G. Plyler, et al on Aug. 13, 1973 for a "Printed Circuit Connector Terminal" now U.S. Pat. No. 3,864,007 and assigned to the assignee of this invention, there is disclosed a unitary sheet metal terminal having upright wings which engage one side of a printed board and a depending tongue which is inserted through a hole in the circuit board and biasingly engages a conductor strip on the other side of the printed circuit board. Thus the biasing force for mechanically securing the terminal to the printed circuit board and the biasing force for effecting electrical contact between the terminal and the conductor strip are both provided by the depending tongue and consequently are the same.

An object of this invention is to provide an electrical connector means for a printed circuit board in which the terminal has means for mechanically securing the terminal to the printed circuit board which operate independently of the means for effecting electrical contact with the conductor strip on the printed circuit board so that the terminal may be secured to the printed board with a biasing force greater than that effecting electrical contact with the conductor strip.

The U.S. Pat. No. 3,611,249 issued to Robert L. Lovrenich on Oct. 5, 1971 for a "Completely Mechanical Solderless Electrical Terminal Assembly for Connecting a Wire To a Circuit Board" shows a terminal in FIGS. 14–17 which may be snap inserted into a hole in a circuit board and has means for securing the terminal to the printed circuit board which operate independently of a resilient tongue engaging the conductor strip. The mechanical securing means, however, grip portions of the printed board adjacent opposite sides of the hole resulting in a complex motion for inserting portions of the terminal, particularly the protruding resilient tongue, through the hole. In comparison, an object of this invention is to provide an electrical connector means for a printed circuit board in which the terminal has independent securing means which grip a portion of the circuit board on only one side of the hole thereby greatly simplifying the motion required to mechanically secure the terminal to the circuit board.

Another object of this invention is to provide an electrical connector means comprising a simple unitary sheet metal terminal which like the terminal disclosed in the aforesaid patent application may be secured to a printed circuit board by a simple two step motion of a direct perpendicular insertion of portions of the terminal through properly sized hole and a lateral shifting into gripping engagement with portions of the terminal board adjacent the hole but which like the Lovrenich terminal has means for securing the terminal to the printed circuit board which operate independently of the tongue which engages the conductor strip.

Another object of this invention is to provide an electrical connector means for connecting an electrical lead or wire to a printed circuit board having one or more of the following features: a terminal which has relatively rigid portions, for example, upright slotted wings, for securing the terminal to the printed circuit board and relatively resilient portions, for example, a generally planar tongue, for effecting electrical connection with printed circuit portions of the printed circuit board; a terminal with a forwardly protruding nose for pushing the terminal laterally into firmly seated engagement with a portion of the printed circuit board adjacent the hole through which portions of the terminal are inserted; cooperative means on the terminal and the printed circuit board for latching the terminal to the printed circuit board; means on the terminal board for guiding the terminal into operative engagement therewith; means on the printed circuit board for protecting the conductor strip during the assembly process; means on the printed circuit board for protecting a portion of the terminal beneath the printed circuit board.

The exact nature of this invention as well as other objects and features thereof will be readily apparent from consideration of the following specification relating to the annexed drawing in which.

Figure 4:
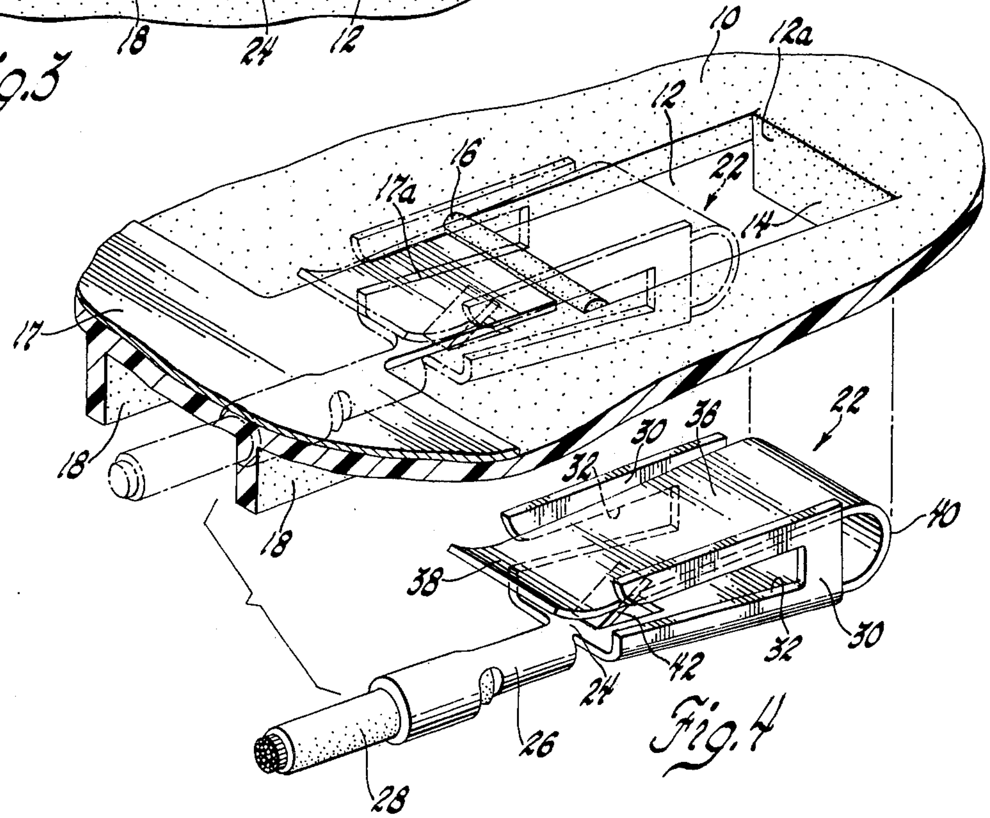
FIG. 4 is a exploded perspective view of the terminal and printed circuit board shown in FIGS. 1–3 with the terminal also shown in phantom in its completely assembled position.

Referring now to the drawing and more particularly to FIG. 4, there is shown a printed circuit board 10 having a rectangular through hole 12 spaced wholly inwardly from adjacent side edges thereof. The circuit board 10 includes a depending flange 14 adjacent one of the shorter sides **12*a* of the hole 12 and an upwardly protruding rounded lip 16 adjacent the opposite shorter side 12*b* of the hole 12. Suitably secured to the upper side of the circuit board is a printed circuit comprising a flat metal conductor sheet 17, preferably copper, of any desired circuit pattern and which includes a narrow strip portion 17*a* lying adjacent the shorter side 12a of the hole 12 and the rounded lip 16 for making contact with an electrical terminal. A pair of spaced parallel rails 18 depend from the lower side of the printed circuit board 10. The rails 18 extend transversely from the shorter side 12*b* of the hole 12 and away therefrom (toward the left as viewed in the several figures). The underside of the board also has a cavity 20 located between the rails 18 and spaced from the shorter side 12b of the hole 12.**

The terminal 22 is of unitary sheet metal construction and comprises a generally flat body portion 24 having an integral ferrule portion 26 contiguous with a rearward end thereof. The ferrule portion 26 may be of the type comprising spaced pairs of wings which are respectively crimped about the insulator jacket and exposed ends of the conductor of an electrical lead or wire 28 in conventional manner or any other suitable type. The terminal 22 further comprises a pair of upright wings 30 which are integrally attached respectively to the laterally spaced longitudinal sides of the body portion 24 and extend upwardly therefrom. Each of the wings 30 has a longitudinal slot 32 which opens rearwardly. The slots 32 in the wings 30 are aligned with each other for receiving a portion of the printed circuit board 10 adjacent the shorter side 12b of the hole 12. The slots 32 preferably are tapered in the rearward direction and the minimum opening of the slots is less than the thickness of the printed circuit board 10 so that the wings 30 biasingly engage opposite surfaces of the printed circuit board 10 when the printed circuit board 10 is inserted into the slot 32.

The terminal 22 further includes a generally planar flexible tongue portion 36 which terminates in an outwardly flared rearward portion 38. The tongue 36 is connected to the forward end of the body portion 24 by a U-shaped nose portion 40 which protrudes forwardly of the wings 30 for a purpose described hereinafter. The tongue portion 36 converges toward the body portion 24 in the rearward direction and thus when the terminal 22 is firmly seated on the printed circuit board 10, the tongue portion 36 biasingly engages the narrow conductor strip portion 17a. Since the wings 30 alone secure the terminal to the board, the bias of the wings 30 engaging opposite surfaces of the printed circuit board 10 may be greater than the bias of the tongue portion 36. The terminal 22 also includes a latch finger 42 struck from the body portion 24 and inclined upwardly and forwardly therefrom.

The terminal 22 may be attached to the printed circuit board 10 simply by aligning the tongue portion 36, nose portion 40 and wing portions 30 of the terminal 22 with the hole 12 and inserting these portions upwardly therethrough with a perpendicular motion. Of course, the hole 12 must be properly sized, that is, the width of the hole must be at least as large as the width between the upright wings 30 and the length of the hole between the shorter sides 12*a* and 12*b* must be at least as large as the longitudinal distance between the most forward portion of the protruding nose portion 40 and the most rearward portion of the tongue portion 36 (or the portions of the wing portions 30 above the slots 32 if longer) of the terminal. The depending flange 14 of the printed circuit board 10 may be used in cooperation with the nose portion 40 of the terminal to assist alignment in the longitudinal direction while the rails 18 may offer some assistance in lateral alignment.

Figure 1:
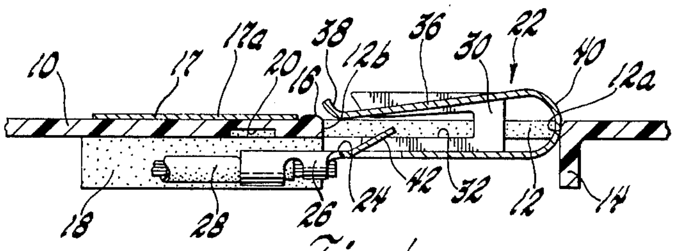
FIG. 1 is a longitudinal section through an electrical connector means in accordance with this invention showing a terminal in the process of being assembled to a printed circuit board.
Figure 2:
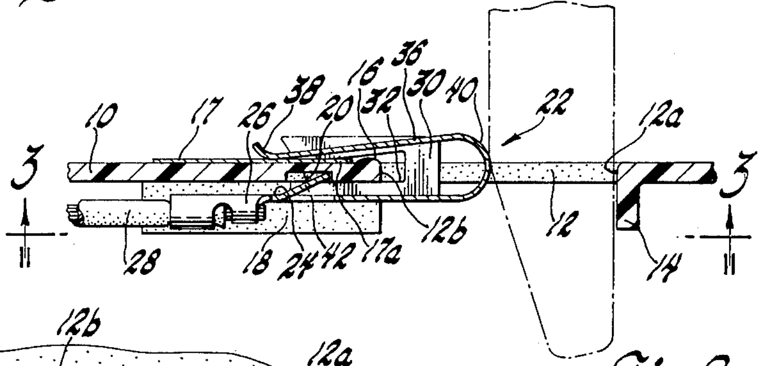
FIG. 2 is a longitudinal section similar to FIG. 1 showing the terminal completely assembled to the printed circuit board.
Figure 3:
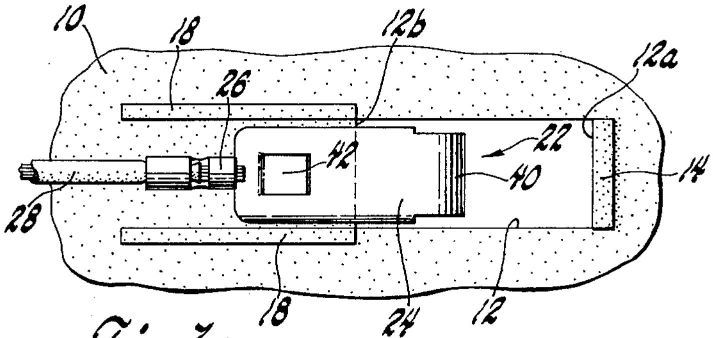
FIG. 3 is a view taken substantially along the line 3—3 of FIG. 2 and looking in the direction of the arrows.

After proper disposition in the hole 12, the terminal 22 is simply shifted laterally toward the left as viewed in the drawing until portions of the printed circuit board 10 are fully seated in the slots 32. The rails 18 are preferably spaced to guide the terminal 22 during assembly and properly locate the wings 30 in engagement with the printed circuit board 10 at locations spaced from the conductor strip portion 17*a*. During assembly, the rounded lip 16 lifts the tongue portion 36 onto the conductor strip portion 17*a* thereby protecting the edge thereof. The final lateral shifting of the terminal 22 into firmly seated engagement with portions of the printed circuit board 10 may be accomplished mechanically, for instance, by the vertically reciprocable tool shown in phantom in FIG. 2. On downward movement the tool engages the protruding nose portion 40 and urges the terminal 22 to the left into firmly seated engagement where the latch finger 42 engages the cavity 20 on the underside of the printed circuit board 10. After completed assembly, the rails 18 and flange 14 protect the portions of the terminal 22 beneath the printed circuit board 10.

Thus it can be seen that the present invention provides an improved electrical connector means comprising a unitary sheet metal terminal having means for securing the terminal to a printed circuit board which operate independently of the terminal portions engaging the conductor strip and which may be secured to the printed circuit board in a simple manner and which may include further beneficial features.

We wish it to be understood that we do not desire to be limited to the exact details of construction shown and described, for obvious modifications will occur to a person skilled in the art.

What is claimed is:

1. Electrical connector means for connecting an electrical lead to a printed circuit via a hole through the printed circuit board spaced wholly inwardly from adjacent side edges of the printed circuit board comprising:

a unitary sheet metal terminal having a generally planar body portion and an integral ferrule portion contiguous with a rearward end thereof, a pair of laterally spaced upright wings integrally attached respectively to laterally spaced longitudinal sides of said body portion and extending upwardly therefrom, each of said wings having a longitudinal slot which opens rearwardly and extending substantially the length of the wing, said slots being in mutual lateral alignment for receiving portions of a printed circuit board adjacent a hole therethrough spaced wholly inwardly from the side edges thereof, a generally planar resilient tongue portion disposed between said wings and converging rearwardly toward said body portion for biasingly engaging a conductor strip on an upper surface of the printed circuit board adjacent said hole when the portions of said printed circuit board are operatively disposed in said slots, said flexible tongue having an upwardly flared rearward end portion for guidance onto the conductor strip portion, and a U-shaped nose portion connecting said tongue portion to said body portion and protruding forwardly of said wings for pushing said terminal into firmly seated engagement with portions of the printed circuit board received in said slots.

2. Electrical connector means for connecting an electrical lead to a printed circuit via a hole through the printed circuit board spaced wholly inwardly from adjacent side edges of the printed circuit board comprising:

a unitary sheet metal terminal having a generally planar body portion and an integral ferrule portion contiguous with a rearward end thereof, a pair of laterally spaced upright wings integrally attached respectively to laterally spaced longitudinal sides of said body portion and extending upwardly therefrom, each of said wings having a rearwardly tapering longitudinal slot which opens rearwardly, said slots being in mutual lateral alignment for receiving portions of a printed circuit board adjacent a hole therethrough spaced wholly inwardly from the side edges thereof, a generally planar resilient tongue portion disposed between said wings and converging rearwardly toward said body portion for biasingly engaging a conductor strip on an upper surface of the printed circuit board adjacent said hole when the portions of said printed circuit board are operatively disposed in said slots, said resilient tongue having an upwardly flared rearward end portion for cooperation with a raised lip on said printed circuit board to lift said tongue onto a conductor strip portion on said printed circuit board, a U-shaped nose portion connecting said tongue portion to said body portion and protruding forwardly of said wings for pushing said terminal into firmly seated engagement with portions of said printed circuit board received in said slots, and a latch finger bent upwardly and forwardly from said body portion for cooperative latching engagement with a cavity in the underside of the printed circuit board.

3. Electrical connector means for connecting an electrical lead to a printed circuit via a hole through the printed circuit board spaced wholly inwardly from adjacent side edges of the printed circuit board comprising:

a printed circuit board having a generally rectangular hole therethrough spaced wholly inwardly from its adjacent side edges thereof, said printed circuit board having a depending flange adjacent a first side of the hole, depending spaced rails extending transversely from an opposite side of the hole, a rounded lip adjacent said first side of the hole protruding above an upper surface of said printed circuit board, a printed circuit secured to said upper surface having a conductor strip portion aligned with said rails and terminating adjacent said first side of said hole, a unitary sheet metal terminal having a generally planar body portion and an integral ferrule portion contiguous with a rearward end thereof, a pair of laterally spaced upright wings integrally attached respectively to laterally spaced longitudinal sides of said body portion and extending upwardly therefrom, each of said wings having a longitudinal slot which opens rearwardly, said slots being in mutual lateral alignment and receiving portions of said printed circuit board adjacent said opposite side of the hole through the printed circuit board spaced wholly inwardly from the side edges thereof, said wings biasingly engaging said upper surface of said printed circuit board at locations spaced from said conductor strip portion, a generally planar resilient tongue portion disposed between said wings and converging rearwardly toward said body portion biasingly engaging the conductor strip on the upper surface of the printed circuit board adjacent said hole, said resilient tongue having an upwardly flared rearward end portion engaged by said raised lip on said printed circuit board to lift said tongue onto the conductor strip portion on the printed circuit board during assembly, a U-shaped nose portion connecting said tongue portion to said body portion and protruding forwardly of said wings for pushing said terminal into firmly seated engagement with said portions of said printed circuit board received in said slots, and a latch finger bent upwardly and forwardly from said body portion in cooperative latched engagement with a cavity in the underside of the printed circuit board, and the hole through said printed circuit board being sized to perpendicularly receive portions of said terminal above said slots during assembly.

* * * * *